(12) United States Patent
Senouci et al.

(10) Patent No.: US 8,649,137 B2
(45) Date of Patent: Feb. 11, 2014

(54) SEMICONDUCTOR DEVICE AND METHOD OF FORMING SAME FOR ESD PROTECTION

(75) Inventors: Noureddine Senouci, Saint-Blaise/Neuchâtel (CH); Alexander Heubi, La Chaux-de-Fonds (CH)

(73) Assignee: Semiconductor Components Industries, LLC, Phoenix, AZ (US)

( * ) Notice: Subject to any disclaimer, the term of this patent is extended or adjusted under 35 U.S.C. 154(b) by 131 days.

(21) Appl. No.: 13/277,862

(22) Filed: Oct. 20, 2011

(65) Prior Publication Data

US 2013/0100561 A1   Apr. 25, 2013

(51) Int. Cl.
*H02H 3/20* (2006.01)
*H02H 9/04* (2006.01)

(52) U.S. Cl.
USPC ........... 361/56; 361/91.1; 361/91.2; 361/91.5

(58) Field of Classification Search
USPC ................................. 361/56, 91.1, 91.2, 91.5
See application file for complete search history.

(56) References Cited

U.S. PATENT DOCUMENTS

| | | | | |
|---|---|---|---|---|
| 3,751,686 A * | 8/1973 | Sherwood | ...... | 327/405 |
| 4,581,929 A * | 4/1986 | Sugiura | ...... | 73/204.15 |
| 5,400,202 A * | 3/1995 | Metz et al. | ...... | 361/56 |
| 5,978,192 A | 11/1999 | Young et al. | | |
| 7,158,357 B2 * | 1/2007 | Hu | ...... | 361/56 |
| 2003/0067726 A1* | 4/2003 | Voldman | ...... | 361/91.2 |
| 2007/0171587 A1 | 7/2007 | Lee et al. | | |
| 2009/0040671 A1 | 2/2009 | Zhang | | |
| 2009/0197377 A1 | 8/2009 | Chalamala et al. | | |
| 2009/0201615 A1 | 8/2009 | Bernard et al. | | |

* cited by examiner

*Primary Examiner* — Rexford Barnie
*Assistant Examiner* — Zeev V Kitov
(74) *Attorney, Agent, or Firm* — Patents on Demand, P.A.; Scott M. Garrett; Brian K. Buchheit (57) ABSTRACT

In an embodiment a circuit provides protection against electrostatic discharge (ESD). A shunt device is controlled to provide a current bypass upon the occurrence of an ESD event. A trigger circuit controls operation of the shunt device and includes an inverter and a hysteresis means to prevent oscillation of the trigger circuit. A reference is used to trigger the control circuit and has a time constant associated with it to distinguish between power up events and ESD events.

20 Claims, 4 Drawing Sheets

SEMICONDUCTOR DEVICE AND METHOD OF FORMING SAME FOR ESD PROTECTION

BACKGROUND

The invention relates generally to methods, semiconductor devices, electrical and electronic circuits, and products useful in protecting against damage to electronics from electrostatic discharge (ESD) and other high voltage transients.

ESD is a pervasive concern in the design of electronic devices using semiconductor components, and for integrated circuits in particular. As integrated circuit fabrication processes improve and reduce distances between semiconductor structures, the need for improved ESD protection likewise increases. A common approach to ESD protection is to provide a clamp device that provides a shunt path between the positive and negative inputs of a protected semiconductor device upon being triggered by an ESD event. One concern in selecting an ESD protection strategy is differentiating between a power up event and an ESD event. Differentiating between power-up and ESD events is necessary to allow a protected semiconductor device to power up and not to activate the clamp circuit during power up. Another concern is to avoid an oscillation condition of the clamp device. Oscillation can occur when the clamp device is triggered and reduces the voltage during an ESD event enough to reset the clamp device while the effect of an ESD event is still present, resulting in the voltage rising again and re-triggering the clamp device. Accordingly, there is a need for an ESD protection means that allows for power up without triggering the protection circuit, and when triggered by an ESD event, does not oscillate.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE DRAWINGS

While the specification concludes with claims defining features of embodiments that are regarded as novel, it is believed that such embodiments will be better understood from a consideration of the description in conjunction with the drawings. As required, detailed embodiments are disclosed herein; however, it is to be understood that the disclosed embodiments are, in general, exemplary. Some embodiments may be implemented in alternative forms. For example, the invention can be embodied as a semiconductor device or product, a circuit, or a method, including a method of forming a semiconductor device or circuit, among numerous other embodiments. Semiconductor products and devices, and methods of forming and/or configuring them, disclosed herein can be fabricated using conventional techniques along with the novel processes taught herein, and can include integrated or discrete circuit arrangements, or both. Therefore, specific structural and functional details disclosed herein are not to be necessarily interpreted as limiting, but as a basis for the claims and as a representative basis for teaching one skilled in the art to variously employ the invention in any appropriately detailed structure. Further, the terms and phrases used herein are not intended to be limiting but rather to provide an understandable description of the invention. However, where a definition is provided for a term or phrase, the provided definition should be used in interpreting the claims invoking the term or phrase.

Embodiments of the invention take advantage of the differences in the electrical characteristics of power up events and ESD events, as well as changes in voltage from a steady state powered up condition. Generally, a voltage differential circuit is used to differentiate between the fast change in voltage, referred to as "rise time," of an ESD event over a power-up event which has a much lower rise time, or no rise in the case of a steady state operating condition. In some situations the power-up voltage rise time can be controlled by the power supply specifically to avoid triggering the disclosed ESD protection circuits. In at least one embodiment a time constant circuit is used that can include a resistor and capacitor connected in series between the positive and negative power rails of a circuit being protected. The time constant circuit provides a delayed version of any change in voltage at the input, where the delay is sufficient to distinguish between routine power up events and ESD events. The time constant circuit takes advantage of the fact that power up events have a slower voltage rise time than ESD events. Thus, during a power-up event the difference between the input voltage and the delayed voltage will be smaller than during an ESD event.

The time constant circuit controls operation of a trigger circuit that includes an inverter stage with a trailing transistor coupled in series with the inverter, and a latching transistor driven by the output of the inverter. The trailing transistor and latching transistor provide a hysteresis effect for the switching of a clamp device relative to the voltage between the power rails. The inverter and latching circuit control operation of the clamp device or clamp transistor such that upon the occurrence of an ESD event the clamp transistor transitions from a high impedance state to a very low impedance state to shunt current and prevent an excessive voltage differential while dissipating electric charge from the ESD event.

Figure 1:
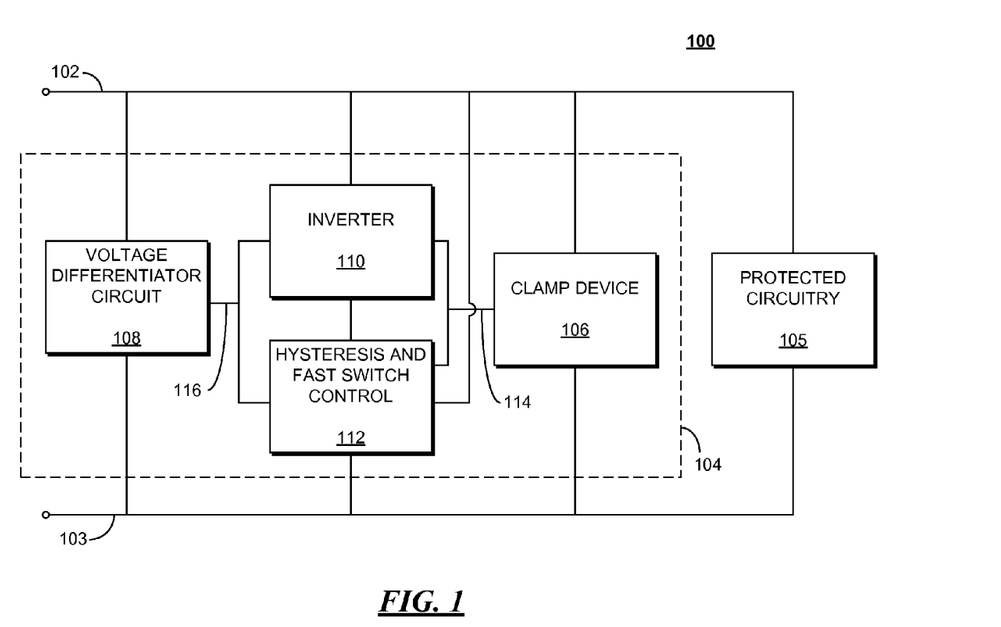
FIG. 1 shows a block diagram schematic for a circuit protected by an ESD protection circuit in accordance with an embodiment.

Referring now to FIG. 1, there is shown a block diagram schematic for circuitry 100 protected by an ESD protection circuit 104 in accordance with at least one embodiment. The circuitry 100 includes protected circuitry 105 that is protected from the potential effects of ESD events by the ESD protection circuit 104. The ESD protection circuit 104 and the protected circuitry 105 can be integrated together, for example, in an integrated circuitry package, and can be formed on a common semiconductor substrate. Alternatively, the ESD protection circuit 104 and protected circuitry 105 can be discretely implemented as separate circuit elements, even packaged separately, or they can be implemented as a combination of discrete and integrated components. The ESD protection circuit 104 and the protected circuitry 105 are commonly connected between lines 102 and 103, which represent electrical conductors to supply voltage and electrical current to the protected circuitry 105. Line 103 can represent a ground or reference line, which can be referred to as a negative input or voltage line, and line 102 can represent a positive input or voltage line. The ESD protection circuit 104 prevents an excessive voltage from occurring between the lines 102 and 103 upon the occurrence of an ESD event.

The ESD protection circuit includes a clamp device 106 that is essentially an electrically controlled switch, such as, for example, a transistor. The clamp device is operated in either a high impedance state, generally, but switched to a low impedance, shunt state upon occurrence of fast change in voltage between lines 102 and 103 that would correlate to an ESD event. In the present disclosure, reference to an ESD event means the occurrence of a rapid and sufficiently large change in voltage between the inputs such that it would be consistent with an actual ESD event. An actual ESD event generally refers to the discharge of electric charge into either, or both, of lines 102, 103, such as from a human body, at a high voltage. During the occurrence of an ESD event, the clamp device is switched to its low impedance state, providing a shunt path between lines 102, 103 through which charge flows, to suppress what would otherwise be an excessive voltage between the lines 102, 103. At all times outside of ESD events the clamp device is in a high impedance state, and essentially no significant current flows through it.

The ESD protection circuit protects the protected circuitry 105 both when the there is no power applied to lines 102, 103 as well as when a steady, "direct current" (DC) voltage is applied to the lines 102, 103 to provide power to the protected circuitry. Operation of the clamp device is, in part, controlled by an inverter 110. The inverter 110 is responsive to a voltage differentiator circuit 108 and a hysteresis and fast switch control circuit 112. The inverter applies a switch signal to a switch input 114 of the clamp device 106. The switch signal is generally either a low voltage substantially equal to the voltage level on line 103, or a high voltage substantially equal to the voltage on line 102. When the switch signal is at the low voltage level the clamp device is off, in its high impedance mode, and when the switch signal is at the high voltage level the clamp device will switch to its low impedance state. The inverter 110 provides the switch signal responsive to the output 116 of the voltage differentiator circuit 108. The steady state value of the output 116 will be substantially equal to the voltage on line 102, relative to line 103. Generally the output 116 tracks or follows changes in voltage on line 102, but with a delay of a predetermined time constant. Accordingly, as the voltage on line 102 changes, there will be a differential between the voltage on line 102 and the output 116 while the voltage on line 102 continues to change. When the voltage on line 102 reaches a steady state, the output 116 voltage will also reach substantially the same value some time afterwards. A sufficient voltage differential between the voltage on line 102 and the output 116 triggers the inverter to switch the clamp device 106 on. Thus, the time constant of the voltage differentiator circuit 108 must be selected such that power up events do not trigger the inverter, while ESD events, which have a much faster rise time, do trigger the inverter.

The hysteresis and fast switch control circuit 112 is also responsive to the switch signal 114 as well as the output 116 of the voltage differentiator circuit 108, and, in part, allows the inverter 110 to trigger or change the inverter output faster than the inverter 110 would normally trigger without the fast switch control 112. The hysteresis and fast switch control 112 also acts to prevent the inverter 110 from oscillating during an ESD event by causing the inverter 110 to trigger and reset at different voltage conditions during voltage rise and voltage falling times, respectively, for voltage between line 102 and output 116 of the voltage differentiator circuit 108.

Thus, the voltage differentiator circuit 108 provides an output voltage 116 that generally tracks the voltage on line 102 (using line 103 as a reference) and will settle at the same voltage as on line 102 at steady state conditions, but the output voltage 116 does not change as fast as the voltage on line 102 changes. The rate at which the output voltage 116 changes relative to voltage changes on line 102 can be controlled by configuring a time constant of the voltage differentiator circuit 108 to a desired value. The inverter 110 provides a voltage output signal to the input 114 of the clamp device. The output voltage of the inverter 110 is either at the voltage level of line 102 or line 103. The inverter 110 inverts its output when the voltage differential between line 102 and the output 116 of the voltage differentiator reaches a threshold level when voltage on line 102 is rising, and reverts or resets its output as the voltage on line 102 is falling at a voltage controlled by the hysteresis and fast switch control circuit 112. The clamp device 106 operates as a voltage controlled switch, and remains in a high impedance mode until the inverter 110 output inverts, whereupon the clamp device 106 will switch to a low impedance mode until the inverter 110 output reverts or resets. Those skilled in the art will appreciate that the various circuit elements can be realized in numerous ways using a variety of components.

Figure 2:
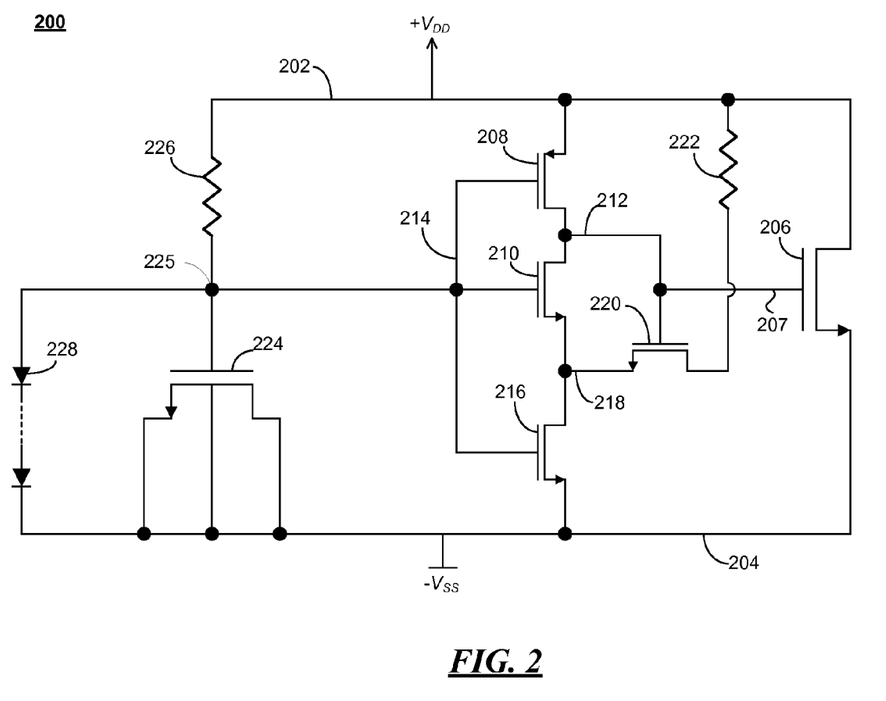
FIG. 2 shows a circuit schematic for an ESD protection circuit in accordance with an embodiment.

Referring to FIG. 2, there is shown a circuit schematic for an ESD protection circuit 200 in accordance with at least one embodiment. The circuit is an example of one contemplated implementation of the more general schematic of FIG. 1, and prevents excessive voltage (either positive or negative polarity) between a positive voltage rail 202 ($V_{DD}$) and a negative voltage rail 204 ($V_{SS}$). The circuit 200 generally protects another circuit, or additional circuitry, which can use the positive 202 and negative 204 voltage rails for power. As described here, the positive voltage rail 202 and negative voltage rail 204 differ in that the positive voltage rail 202 is at a higher voltage potential that the negative voltage rail 204 during normal operation, i.e. providing electrical power to a circuit connected to the positive 202 and negative 204 voltage rails.

The positive voltage rail 202 can be coupled to a regulated voltage source and the negative voltage rail 204 can be coupled to a ground potential or other reference. When the circuit is not powered, there is generally no voltage difference between the positive and negative rails 202, 204, but the circuit can still experience an ESD event in the course of handling a device or other package containing the circuit 200. Generally the source of an ESD event is a human body. In testing, one model often used to simulate a human body-sourced ESD event is a 200 picofarad capacitance charged to 4 kilovolts, and discharged through a 1.5 KOhm resistance in series with a 75 nano-Henry inductance, although other models are known and used in the industry.

A clamp transistor 206 operates in two modes. In one mode it is a high impedance, and no significant electric current flows through the clamp transistor 206 from the positive voltage rail 202 to the negative voltage rail 204. The clamp transistor 206 is in the high impedance mode during all times other than when it is switched during the occurrence of ESD events. Upon the occurrence of an ESD event, however, the clamp transistor 206 is switched to a low impedance mode to provide a path for electric current to pass from the positive voltage rail 202 to the negative voltage rail 204, which prevents an excessive voltage differential between the positive voltage rail 202 and the negative voltage rail 204.

The clamp transistor 206 is generally a transistor device and can be, for example, a complementary metal oxide field effect transistor (CMOS) having an n-type configuration. As such, the clamp transistor 206 can have a source node coupled directly to the negative voltage rail 204 and a drain coupled directly to the positive voltage rail 202. A gate 207 acts as a clamp control node; when the gate 207 and source voltage are at substantially the same voltage potential, clamp transistor 206 is in a high impedance mode and substantially no current will flow from the positive voltage rail 202 to the negative voltage rail 204 through the clamp transistor 206. As the voltage at the gate 207 increases above a threshold voltage level relative to the source of the clamp transistor 206, the clamp transistor 206 switches to a very low impedance mode, resulting in very little electrical impedance between the positive voltage rail 202 and the negative voltage rail 204 through the clamp transistor 206.

The clamp transistor 206 is controlled by a control circuit including an inverter pair of transistors 208, 210, a trailing transistor 216, a latching transistor 220, and a resistor-capacitor (RC) circuit made up of resistor 226 and capacitor 224. The resistor 226 and capacitor 224 are coupled in series between the positive voltage rail 202 and the negative voltage rail 204, with the resistor coupled to the positive voltage rail 202 and the capacitor coupled to the negative voltage rail 204. The capacitor can be formed by the gate to source/drain capacitance of a field effect transistor, or it can be a conventional capacitor component, or any other formation of a stable capacitance. A node, referred to herein as RC node 225, is formed where the resistor 226 and capacitor 224 are coupled together. The voltage at the RC node 225 relative to the positive voltage rail 202 drives operation of the trigger circuit, which includes the inverter pair 208, 210, the trailing transistor 216, and the latch transistor 220.

The RC circuit 224, 226 of the present embodiment operates as the voltage differentiator circuit 108 of FIG. 1, and allows discrimination between ordinary power up events and ESD events. A power up event typically has a voltage rise rate that is much slower than that of an ESD event. Accordingly, the values of the resistor 226 and capacitor 224 are selected so that the resulting time constant of the RC circuit produces a voltage at RC node 225 that does not trigger the inverter transistors 208, 210 during a power up event, but which will trigger the inverter transistors 208, 210 during an ESD event. The inverter transistors 208, 210 of the present embodiment operate as the inverter 110 of FIG. 1. The resistor 226 and capacitor can be formed in an integrated circuit along with the other circuit elements, using conventional integrated circuit techniques, or alternatively, one or both of them can be discrete components that can be, for example, external to an integrated circuit package including the other circuit components. The voltage differential between the positive voltage rail 202 and inverter input node 214 (which is, electrically, substantially the same as the voltage of the RC node 225) is the source to gate voltage of the p-type transistor 208, and controls operation of the p-type transistor 208. One or more diodes 228 can be connected in parallel with the capacitor 224 to establish a protection voltage limit across the capacitor 224, to protect the capacitor 224 from excessive voltage. The diodes are connected such that their cathode is most negative, with the anode of the highest diode in the series coupled to the RC node 225. The diodes 228 also provide a leakage current path to discharge the capacitor when power is removed from the circuit 200.

During a power up event, where the difference between the positive voltage rail 202 and the negative voltage rail 204 rises from zero volts to a steady DC operating voltage level, the source to drain voltage differential of p-type transistor 208 stays less than the threshold voltage necessary to switch p-type transistor 208 on, due to the RC time constant resulting from the values of resistor 226 and capacitor 224. As the voltage on positive voltage rail 202 rises during power-up the voltage across the capacitor 224, between the RC node 225 and the negative voltage rail 204, rises according to the time constant. Once the voltage at the RC node 225 reaches a threshold level n-type transistors 210, 216 will turn on, effectively clamping the inverter output voltage 212 to the negative voltage rail 204. As a result the clamp transistor 206 will be in a high impedance mode, and the circuit will reach a steady state with the clamp transistor 206, p-type transistor 208, and latching transistor 220 turned off, meaning they will be in a high impedance state, and n-type transistors 210, 216 turned on, meaning they will be in a low impedance state.

When the circuit 200 is exposed to an ESD event, without a power source or supply connected to the circuit 200, the voltage at the RC node 225 is initially at zero volts relative to the negative power rail 204. It can generally be assumed that the positive and negative power rails have an initial voltage differential of zero. Assuming a positive ESD event, which drives the voltage of the positive voltage rail 202 high relative to the negative voltage rail 204, the voltage at the RC node 225 begins rising at a rate responsive to the time constant of the resistor 226 and capacitor 224. In the present example, when no voltage is applied to the circuit, all of the transistors are initially in an off state. Because of the RC time constant, the voltage at the RC node 225 does not rise as fast as the voltage at the positive voltage rail 202 (relative to the negative voltage rail 204), resulting in a voltage differential between the source and the gate of the p-type inverter transistor 208, at the inverter input node 214. At some point as the voltage on positive voltage rail 202 rises during an ESD event (or any similar voltage transient) the voltage differential between the positive voltage rail 202 and the inverter input 214 reaches a sufficiently large difference to cause p-type transistor 108 to switch on, effectively coupling the inverter output node 212 to the positive voltage rail 202. As a result, both the clamp transistor 206 and latching transistor 220 turn on, both being n-type transistors. In the present embodiment, the circuit 200 can be fabricated using complementary MOSFET (CMOS) integrated circuit fabrication processes. Using CMOS processes, the inverter operation of transistor 208, 210 is such that when the p-type transistor 108 turns on, the n-type transistor 210 will switch off, as is known in CMOS inverters generally.

When the latching transistor 220 turns on, it drives the voltage at node 218 to the voltage of the positive voltage rail 202, which provides a form of regenerative feedback, causing the source of n-type transistor 210 to rise above its base voltage, which is connected to the negative voltage rail 204. Generally, all of the n-type transistors in circuit 200 will have their base connected to the negative voltage rail 204 due to being formed in the same integrated circuit fabrication process. The latching transistor 220 and trialing transistor provide a hysteresis effect, and cooperatively operate as the hysteresis and fast switch control circuit 112 of FIG. 1. The hysteresis results from Schmitt-trigger configuration of latching transistor 220 and trailing transistor 216 which latches the inverter state once it is triggered. The amount of hysteresis can be controlled by the relative geometries (size ratio) of latching transistor 220 and trailing transistor 216. Resistor 222 prevents excessive current through latching transistor 220.

Figure 3:
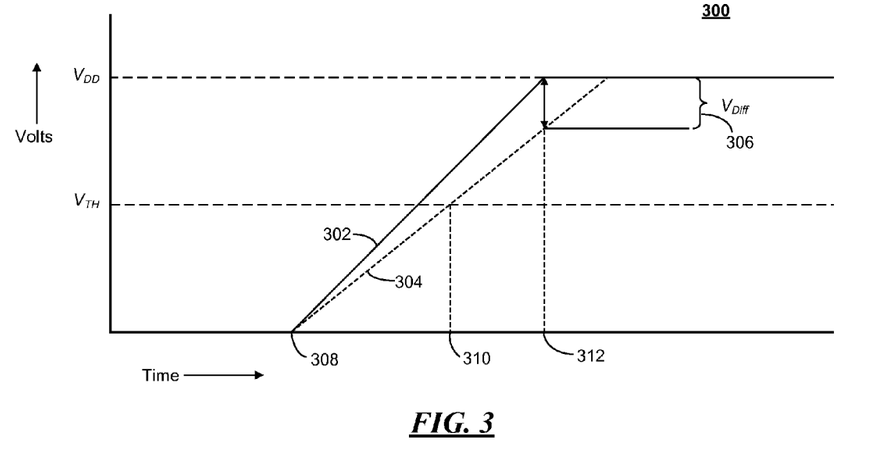
FIG. 3 shows a graph chart of voltage over time for certain nodes of an ESD protection circuit, in accordance with an embodiment, during a typical power up event.

FIG. 3 shows a graph chart 300 of voltage over time for certain nodes of an ESD protection circuit, in accordance with an embodiment, during a typical power up event. During a typical power up event, the clamp device is not triggered. The graph shows the voltage on a positive input (relative to a negative input or other reference) on line 302, and the voltage provided to an inverter on line 304. Thus, line 302 can represent voltage on positive voltage rail 202, and line 304 can represent the voltage and node 225 of FIG. 2. Initially, there is no voltage evident anywhere in the circuit. At time 308, power is applied to the circuit by a typical power supply. Accordingly, voltage begins rising as indicated by line 302 after time 308. Likewise, the voltage represented by line 304, which can represent the output of the time differentiator circuit 108 of FIG. 1 or the output of the RC circuit at node 225 of FIG. 2, or some other delay means, begins rising as well, but not as fast, due to the time constant. Initially all of the switches in the ESD protection circuit are off. At time 310, the voltage provided to the inverter reaches a threshold level, causing the inverter to output a low voltage to the clamp device. For example, in FIG. 2, at time 310, the n-type inverter transistor 210 and trailing transistor 116 will switch to low impedance states, pulling the voltage at inverter output 112 to the reference or ground voltage level, keeping clamp transistor 106 off.

At time 312 the power voltage, represented by line 302, reaches it maximum value, which is also its steady state value, and levels off, remaining constant thereafter. At that point, the voltage different between lines 302 and 304 is at its greatest (on this graph), and has a differential 306. The difference between the power voltage of line 302 and the inverter input 304 is applied across, for example, the p-type transistor 208 of the inverter in FIG. 2. Specifically, the differential 306, in FIG. 2, is applied across the gate to source voltage of p-type transistor 208. Thus, to avoid tripping the inverter during power up, the voltage differential 306 must be kept below a level that will cause the inverter to switch states, resulting in, for example, the p-type transistor 208 turning on and driving the inverter output to the positive voltage of line 302, which would cause the clamp device to turn on. The voltage differential 306 is kept below the threshold needed to switch the inverter by selection of the time constant used to produce the inverter input, such as, for example, the time constant resulting from the RC circuit of resistor 226 and capacitor 224. In some embodiments it is contemplated that the power can be controlled such that its output voltage rise time will not trigger the ESD protection circuit.

Figure 4:
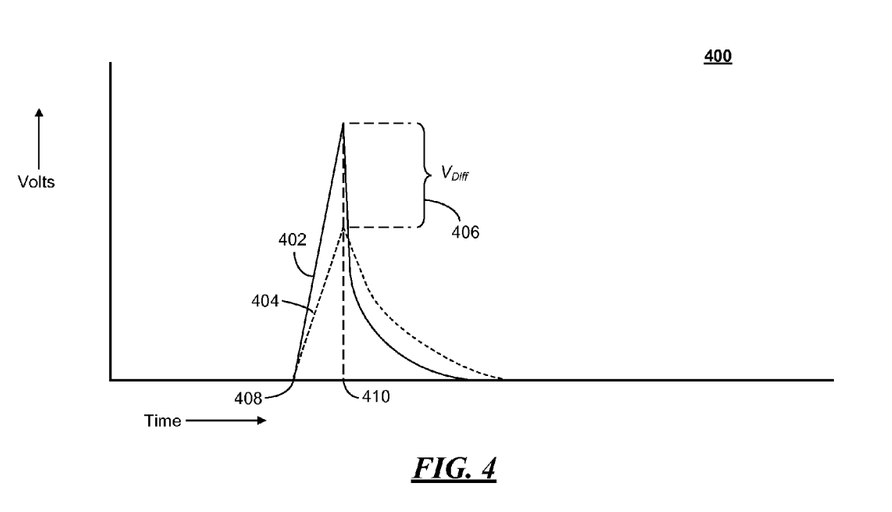
FIG. 4 shows a graph chart of voltage over time for certain nodes of an ESD protection circuit, in accordance with an embodiment, during and ESD event when there is no power applied to the circuitry.

FIG. 4 shows a graph chart 400 of voltage over time for certain nodes of an ESD protection circuit, in accordance with an embodiment, during and ESD event when there is no power applied to the circuitry. In the present chart line 402 represents the voltage on the positive power input or rail, such as positive voltage rail 202, and line 404 represents the input to the inverter, such as RC node 225 of FIG. 2. An ESD event, which can come from a source that is charged to several kilovolts, has a very steep rise time compared to the rise time of a power supply as in FIG. 3. As such, at some point while the voltage is rising, the differential 406 reaches a level sufficient to cause the inverter to switch, which triggers the clamp device to switch to its on state and shunt charge from the positive input to the negative or ground input, thereby preventing an excessive and potentially damaging voltage level across the protected circuitry. The inverter output, such as on line 207 of FIG. 7, will go from essentially zero volts to substantially the value of line 402, and will track with the value of line 402 until the circuit resets and the inverter output switches back.

At time 410 the voltage difference between the voltage on the positive voltage rail of line 402 and the voltage at the RC node 225 online 404 reaches a threshold difference 406 that is sufficient to cause the p-type transistor 208 in the inverter to turn on in low impedance mode. When the p-type transistor 208 turns on, the inverter output 212 switches to the voltage on the positive voltage rail 202, driving the gate 207 of the clamp device 206 high, to the same voltage as is on the positive voltage rail 202, and as a result the clamp device 206 switches to its low impedance mode. Likewise, the latching transistor 220 will also switch on, applying the voltage at the positive voltage rail 202 to the source of the n-type transistor 210 and drain of the trailing transistor 216. The effect of the latching transistor turning on is that it allows the inverter to switch faster by raising the base voltage of then-type transistor of the inverter. Once the clamp device 206 switches to the low impedance mode at time 410, the voltage on the positive voltage rail 202 will immediately begin to drop sharply.

Once the clamp device 206 is switched on, even though the difference between the positive voltage rail 202 and the RC node 225 drops below the threshold to turn the p-type transistor 208 on, the clamp device gate capacitance and the latching transistor 220 gate capacitance retain charge, which can contribute to holding the clamp device 206 on while the charge in the gate capacitances is drained through leakage via n-type transistor 210 and trailing transistor 216. Thus, a hysteresis effect of the Schmitt-trigger arrangement of latching transistor 220 and trailing transistor 216 results and prevents oscillation or other undesired effects during occurrence of the ESD event.

Figure 5:
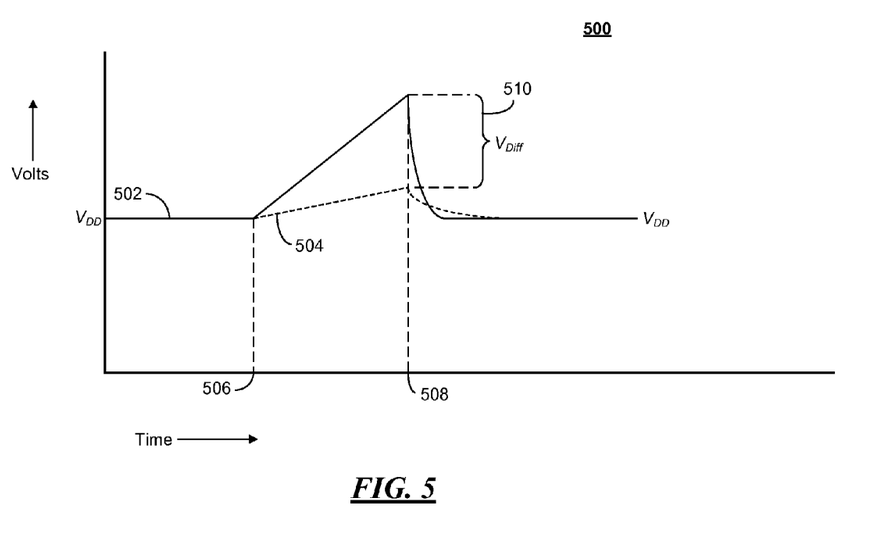
FIG. 5 shows a graph chart of voltage over time for certain nodes of an ESD protection circuit, in accordance with an embodiment, during an ESD when power is applied to the circuitry.

FIG. 5 shows a graph chart 500 of voltage over time for certain nodes of an ESD protection circuit, in accordance with an embodiment, during an ESD event after power is applied to the circuitry. Accordingly, the voltage on the high or positive power input, such as, for example, positive voltage rail 202, is initially at the steady state power voltage $V_{DD}$ and is represented by line 502. Additionally, the inverter input, provided by the RC node 225, also rises to $V_{DD}$ and is represented by line 504. Prior to time 506 the inverter output, such as on line 207 of FIG. 2, is low, keeping the claim device off. The n-type transistors 210 and 216 of FIG. 2 would be in the "on" state under these conditions, and both p-type transistor 208 and n-type transistor 220 will be in their "off" states.

At time 506 an ESD event commences, and as a result the voltage of line 502 begins rising above $V_{DD}$. Likewise, but at a slower rate due to the time constant, the voltage represented by line 504 beings rising. At point 508, the voltage differential 510 between 502 and 504 is sufficient to trigger the inverter to switch, such as, for example, by causing p-type transistor 208 to switch from its "off" state to its "on" state. As a result the output 212 of the inverter switches and drives the clamp device 206 to turn on, in a low impedance mode at point 508. When the clamp device 206 is switched, the voltage of line 502 will drop, as in FIG. 4. Again, the voltage on the positive voltage rail 202 can drop below the voltage of the RC node 225 due to the hysteresis effect of the latching transistor 220 and the trailing transistor 216.

Thus, the teaching of the present disclosure includes and ESD protection circuit that allows ordinary power up events to occur without triggering the ESD protection, and that, upon the occurrence of an ESD event when the circuitry is either powered or unpowered, switches quickly and in a manner that prevents oscillation. Those skilled in the art will further appreciate that another embodiment can include a method of forming a semiconductor device that includes configuring the semiconductor device to form a voltage differentiator circuit, inverter, clamp device, and hysteresis and fast switch control circuit. These elements can be included in an integrated circuit along with the protected circuitry, or it can be implemented discretely or otherwise separately from the protected circuitry.

One embodiment can include a semiconductor device that includes an inverter including a p-type transistor and an n-type transistor coupled in series. The inverter can have an inverter control node and an inverter output node. The p-type transistor can be further coupled to a positive voltage rail. The semiconductor device can further include a trailing transistor coupled between the n-type transistor of the inverter and a negative voltage rail. A trailing node is formed between the trailing transistor and the n-type transistor of the inverter. A clamp transistor is coupled between the positive and negative voltage rails and has a clamp control node coupled to the inverter output node. A latching transistor that has a latching control node can be coupled to the inverter output node, and can be coupled in series between a resistance and the trailing node, where the resistance is further coupled to the positive voltage rail. The semiconductor device can further include a resistor-capacitor (RC) circuit coupled in series between the positive and negative voltage rails. The RC circuit can include a resistor and a capacitor, with the resistor coupled to the positive voltage rail and the capacitor coupled to the negative rail, and an RC node can be defined at the junction of the resistor and capacitor. The RC node can be coupled to the inverter control node. The RC circuit is selected to allow power up events to occur, where voltage between the positive and negative voltage rails increases from zero volts to a nominal operating voltage, without triggering the ESD protection effect, i.e. causing the clamp device to switch to a low impedance mode. However, ESD events, which have a much steeper rise time than power up events, will cause the device to switch the clamp device on.

Another embodiment can include a method of forming a semiconductor device. The method can include forming an inverter including a p-type transistor and an n-type transistor coupled in series that further have an inverter control node and an inverter output node, with the p-type transistor coupled to a positive voltage rail. The method can further include forming a trailing transistor coupled between the n-type transistor of the inverter and a negative voltage rail, and forming a trailing node between the trailing transistor and the n-type transistor of the inverter. The method can also include forming a clamp transistor coupled between the positive and negative voltage rails, the clamp device having a clamp control node coupled to the inverter output node. The method further can include forming a latching transistor having a latching control node coupled the inverter output node, the latching transistor further coupled in series between a resistance and the trailing node, where the resistance is further coupled to the positive voltage rail. Additionally, the method can include forming a resistor-capacitor (RC) circuit coupled in series between the positive and negative voltage rails that includes a resistor and a capacitor, with the resistor coupled to the positive voltage rail and the capacitor coupled to the negative rail that define an RC node at the junction of the resistor and capacitor, and wherein the RC node is coupled to the inverter control node. The processes used to form the various elements can include conventional integrated circuit fabrication methods, circuit board assemblies, and so on.

A further embodiment can include an integrated circuit that includes a voltage differentiator circuit that tracks an input voltage between a positive input and a negative input to the integrated circuit and provides an output based on the input voltage that is time delayed by a preselected time constant. The integrated circuit can include an inverter coupled to the output of the voltage differentiator circuit that is responsive to a difference between the output of the voltage differentiator circuit and the input voltage. The inverter has an inverter output that can generally toggle between a high and a low output voltage state. The integrated circuit can also include a clamp device coupled between the positive input and the negative input and an input coupled to the inverter output and responsive to the inverter output. The integrated circuit of the present embodiment can also include a fast switch and hysteresis control circuit that includes a trailing transistor coupled in series with the inverter, and a latching transistor coupled between the positive input and a positive side of the trailing transistor.

This invention can be embodied in other forms without departing from the spirit or essential attributes thereof. Accordingly, reference should be made to the following claims, rather than to the foregoing specification, as indicating the scope of the invention.

What is claimed is:

1. A semiconductor device, comprising:
    an inverter including a p-type transistor and an n-type transistor coupled in series and having an inverter control node and an inverter output node, the p-type transistor further coupled to a positive voltage rail;
    a trailing transistor coupled between the n-type transistor of the inverter and a negative voltage rail, and forming a trailing node between the trailing transistor and the n-type transistor of the inverter;
    a clamp transistor coupled between the positive and negative voltage rails and having a clamp control node coupled to the inverter output node;
    a latching transistor having a latching control node coupled to the inverter output node, the latching transistor further coupled in series between a resistance and the trailing node, where the resistance is further coupled to the positive voltage rail; and
    a resistor-capacitor (RC) circuit coupled in series between the positive and negative voltage rails and including a resistor and a capacitor, with the resistor coupled to the positive voltage rail and the capacitor coupled to the negative rail, an RC node defined by a junction of the resistor and capacitor, and wherein the RC node is coupled to the inverter control node.

2. The semiconductor device of claim 1, further comprising at least one diode coupled in parallel with the capacitor.

3. The semiconductor device of claim 2, wherein the at least one diode is a plurality of series-connected diodes having a number of diodes, where the number of diodes is selected to limit a maximum voltage across the capacitor.

4. The semiconductor device of claim 1, wherein the capacitor is a metallic-oxide semiconductor field effect transistor having a gate, a drain, and a source, wherein the gate is connected to the resistor and the drain and source are both connected to the negative voltage rail.

5. The semiconductor device of claim 1, wherein the resistor and capacitor of the RC circuit have a resistance value and a capacitance value, respectively, defining an RC time constant, wherein the resistance and capacitor values are selected such that the RC time constant prevents activation of the clamp transistor during power up events, where the power up events have a slower voltage rise time compared to an ESD event, and wherein the RC time constant causes actuation of the clamp transistor during an ESD event.

6. The semiconductor device of claim 1, wherein the latching transistor and the trailing transistor produce a hysteresis effect controlled by the size proportion of the latching transistor to the trailing transistor.

7. A method of forming a semiconductor device, comprising:
    forming an inverter including a p-type transistor and an n-type transistor coupled in series and having an inverter control node and an inverter output node, the p-type transistor further coupled to a positive voltage rail;

forming a trailing transistor coupled between the n-type transistor of the inverter and a negative voltage rail, and forming a trailing node between the trailing transistor and the n-type transistor of the inverter;

forming a clamp transistor coupled between the positive and negative voltage rails and having a clamp control node coupled to the inverter output node;

forming a latching transistor having a latching control node coupled to the inverter output node, the latching transistor further coupled in series between a resistance and the trailing node, where the resistance is further coupled to the positive voltage rail; and forming a resistor-capacitor (RC) circuit coupled in series between the positive and negative voltage rails and including a resistor and a capacitor, with the resistor coupled to the positive voltage rail and the capacitor coupled to the negative rail, an RC node defined by a junction of the resistor and capacitor, and wherein the RC node is coupled to the inverter control node.

8. The method of claim 7, further comprising forming at least one diode coupled in parallel with the capacitor.

9. The method of claim 8, wherein the at least one diode is formed by a plurality of series-connected diodes having a number of diodes, where the number of diodes is selected to limit a maximum voltage across the capacitor.

10. The method of claim 7, wherein the capacitor is formed with a metallic-oxide semiconductor field effect transistor having a gate, a drain, and a source, wherein the gate is connected to the resistor and the drain and source are both connected to the negative voltage rail.

11. The method of claim 7, wherein the resistor and capacitor of the RC circuit are formed to have a resistance value and a capacitance value, respectively, which defines an RC time constant, wherein the resistance and capacitor values are selected such that the RC time constant prevents activation of the clamp transistor during power up events, where the power up events have a slower voltage rise time compared to an ESD event, and wherein the RC time constant causes actuation of the clamp transistor during an ESD event.

12. The method of claim 7, wherein the latching transistor and the trailing transistor are each formed to produce a hysteresis effect controlled by the size proportion of the latching transistor to the trailing transistor.

13. An integrated circuit, comprising:
a voltage differentiator circuit that tracks an input voltage between a positive input and a negative input to the integrated circuit and provides an output based on the input voltage that is time delayed by a preselected time constant;
an inverter coupled to the output of the voltage differentiator circuit and responsive to a difference between the output of the voltage differentiator circuit and the input voltage, the inverter having an inverter output;
a clamp device coupled between the positive input and the negative input and having an input coupled to the inverter output and responsive to the inverter output; and
a fast switch and hysteresis control circuit including a trailing transistor coupled in series with the inverter and a latching transistor coupled between the positive input and a positive side of the trailing transistor, the latching transistor having a latching control node connected to the inverter output.

14. The integrated circuit of claim 13, further comprising at least one diode coupled between the output of the voltage differentiator circuit and the negative input.

15. The semiconductor device of claim 14, wherein the at least one diode is a plurality of series-connected diodes having a number of diodes, where the number of diodes is selected to limit a maximum voltage between the output of the voltage differentiator circuit and the negative input.

16. The semiconductor device of claim 13, wherein the voltage differentiator circuit includes a series RC circuit with a resistor coupled to the positive input and a capacitor coupled to the negative input, and a junction of the resistor and capacitor forming the output of the voltage differentiator circuit, the capacitor is a metallic-oxide semiconductor field effect transistor having a gate, a drain, and a source, wherein the gate is connected to the resistor and the drain and source are both connected to the negative input.

17. The semiconductor device of claim 15, wherein the resistor and capacitor of the RC circuit have a resistance value and a capacitance value, respectively, defining an RC time constant, wherein the resistance and capacitor values are selected such that the RC time constant prevents activation of the clamp transistor during power up events, where the power up events have a slower voltage rise time compared to an ESD event, and wherein the RC time constant causes actuation of the clamp transistor during an ESD event.

18. The semiconductor device of claim 13, wherein the latching transistor and the trailing transistor produce a hysteresis effect controlled by the size proportion of the latching transistor to the trailing transistor.

19. The semiconductor device of claim 2, wherein the at least one diode has a cathode connected to the negative voltage rail, and the at least one diode has an anode connected to the RC node.

20. The method of claim 8, wherein forming the at least diode comprises forming the at least one diode to have a cathode connected to the negative voltage rail, and forming the at least one diode to have an anode connected to the RC node.

* * * * *